United States Patent [19]
Albarran et al.

[11] 4,103,186
[45] Jul. 25, 1978

[54] LOW POWER JFET SWITCH

[75] Inventors: José F. Albarrán, Mexico City, Mexico; Adib R. Hamade, Cupertino, Calif.

[73] Assignee: National Semiconductor Corporation, Santa Clara, Calif.

[21] Appl. No.: 780,932

[22] Filed: Mar. 24, 1977

[51] Int. Cl.² .................... H03K 17/04; H03K 17/68; H01L 29/80
[52] U.S. Cl. .................................. 307/251; 307/304; 357/22; 357/43
[58] Field of Search ................ 307/251, 304, 351–353; 357/22, 43

[56] References Cited

U.S. PATENT DOCUMENTS

| 3,448,293 | 6/1969 | Russell | 307/251 |
| 3,654,394 | 4/1972 | Gordon | 307/251 X |
| 3,740,581 | 6/1973 | Pfiffner | 307/251 |
| 3,916,222 | 10/1975 | Compton | 307/251 |
| 3,955,103 | 5/1976 | Russell et al. | 307/304 X |
| 4,020,365 | 4/1977 | Weir | 307/251 |
| 4,042,836 | 8/1977 | Compton et al. | 307/251 |

Primary Examiner—Larry N. Anagnos
Attorney, Agent, or Firm—Gail W. Woodward

[57] ABSTRACT

In a three JFET switch, a first transistor when turned on is utilized to pass an input voltage to an output. The first transistor is turned on by a second and third transistor having their gates commoned with the first transistor to form a turn on circuit. In its idle state, when the switch is off, a drain circuit conducts through the third transistor, dissipating power. In order to reduce the size of the second and third transistors and hence the power dissipated while maintaining a fast switching speed a bipolar transistor and a fourth JFET are utilized to amplify the drain current of the third transistor for discharging the common gate capacitance of the switch. This allows the second and third transistors to be made small since their current need not be large for high speed switching. Furthermore, the bipolar transistor only turns on during the transition from the open to closed state of the switch and therefore its conduction does not contribute to the quiescent power consumption of the circuit.

2 Claims, 3 Drawing Figures

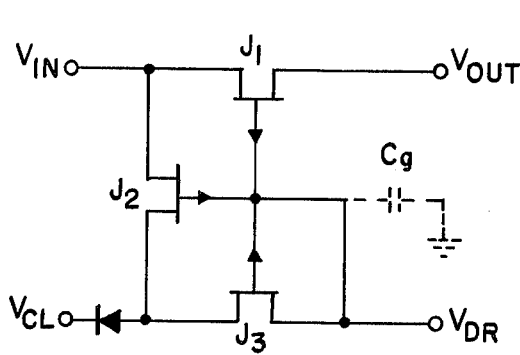
Fig_1 PRIOR ART
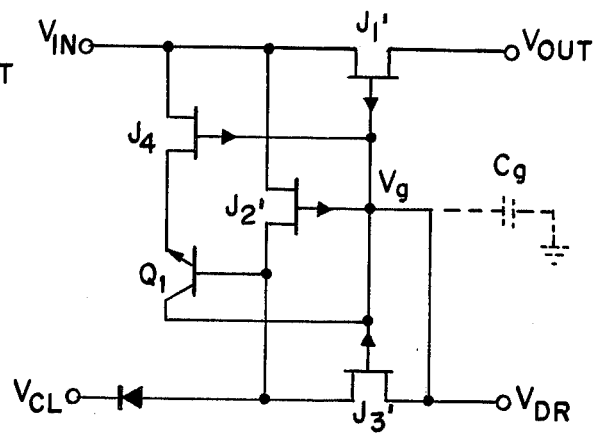
Fig_2
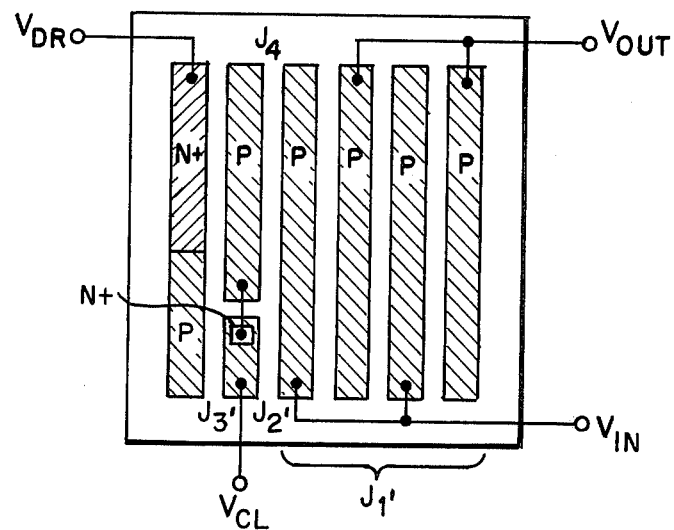
Fig_3

LOW POWER JFET SWITCH

BACKGROUND OF THE INVENTION

This invention relates to integrated circuit analog devices and, more particularly, to a transistor switching circuit for switching an input voltage to an output.

A known JFET switch has been utilized having a three transistor common gate configuration, since this results in a minimum die area during fabrication and high speed characteristics. Three FETs are placed on a common isolated epitaxial island and occupy only fractionally more area than that required by the main switch. The switching speed is increased because of the reduction in the gate capacitance which is a major factor in determining speed.

The prior art approach has the disadvantage that in order to achieve the fast switching characteristics, a large idle current is allowed to flow when the switch is off, thus wasting power and increasing the overall size of the device.

It is therefore an object of this invention to improve the performance of the Tri-JFET switch by reducing the wasted idle power for high speed operation with the resulting reduction in silicon die area.

Briefly, the above object is accomplished in accordance with the present invention by providing a bipolar transistor circuit in combination with the turn-on JFET such that the bipolar transistor turns on only during the transition from open to closed of the switch, and during this transition amplifies the source to drain current of the turn-on transistor to thereby discharge the gate capacitance of the circuit.

The circuit has the advantage that the additional transistor by providing current amplification, makes it possible for the turn-on JFETs to be made small because of their reduced current requirements, without sacrificing any of the high speed switching capabilities of the circuit.

The circuit has the further advantage that it is easy to manufacture because the JFET device and the bipolar device can share one epitaxial island, thus providing considerable area saving on the chip and a sizeable reduction in the common gate capacitance $C_g$.

The foregoing and other objects, features and advantages of the invention will be apparent from the following more particular description of the preferred embodiment of the invention, as illustrated in the accompanying drawings.

DESCRIPTION OF THE DRAWINGS

FIG. 1 is a circuit diagram of a prior art tri-JFET switch;

FIG. 2 is a circuit diagram of a tri-JFET switch modified in accordance with the present invention; and FIG. 3 is a plan view of an integrated circuit layout implementation of the switch of FIG. 2.

DESCRIPTION OF THE PREFERRED EMBODIMENT

Referring now to FIG. 1, the prior art switch will be described. J1 functions as the pass transistor, and J2 and J3 function as the turn-on circuit. The clamp voltage $V_{CL}$ is designed to be equal to or higher than the highest analog input voltage $V_{in}$ to be switched. When the drive voltage $V_{dr}$ rises to a level equal to or higher than the sum of $V_{CL} + V_{be} + V_p$, (where $V_{be}$ is the diode base to emitter voltage drop and $V_p$ is the pinch-off voltage of the JFET) the transistors J1 and J2 turn off. The source-to-drain current ($I_{dss}$) is referred to under these conditions as the idle current. The source-to-drain current ($I_{dss}$) of transistor J3 now flows into the clamp circuit. When the drive terminal is open or when the drive current is not available, transistors J2 and J3 turn on. Transistor J3 is on but it does not conduct current and therefore its gate voltage is equal to its drain voltage. It follows that the gate voltage of J2 is equal to its source voltage, and J2 is turned on. Since J2 does not conduct current, therefore its drain voltage is equal to its gate voltage. This places a short across the gate and source of transistor J1 and it turns fully on. The size (W/1) of transistors J2 and J3 where w is the channel width and 1 is the channel length, determine the switching speed and the idle power of the circuit, since it is the $I_{dss}$ current which discharges the common gate capacitance $C_g$. While this circuit achieves fast switching, it is at the expense of a large idle current which is allowed to flow, thus wasting power and increasing the overall size of the device.

Referring now to FIG. 2, the present invention will be described. The circuit of FIG. 2 is identical to the circuit of FIG. 1 with the addition of a bipolar transistor Q1 and a JFET J4. Also, the sizes of J2' and J3' are made smaller since their current needs are not as large for high speed switching.

When the switch is open, the drive voltage $V_{DR}$ and hence the voltage at the common gate point is greater than the sum of $V_{CL} + V_{be} + V_p$ where $V_p$ is the pinch-off voltage. $V_{CL}$ is maintained higher than the analog input voltage $V_{IN}$. Thus, when the switch is open, J2', J4 and Q1 are off and J3' conducts. When the switch is closed, J3' is not conducting, J2' and J4 are biased on but are not conducting, and the gate voltage $V_g$ is equal to $V_{IN}$. Therefore, Q1 is biased off. Q1 turns on only during the transition from open to closed of the switch. When this occurs Q1 amplifiers the $I_{dss}$ of J3' to thereby discharge the common gate capacitance $C_g$. The current amplification is determined by the ratio between W/1 of J2' and J4. With Q1 in the circuit, J2' and J3' can be made smaller since their current needs are not as large for the same high speed switching capabilities.

Referring now to FIG. 3, the integrated circuit chip layout of the circuit of FIG. 2 is shown. The four FETs and the bipolar transistor are placed in a common expitaxial island and occupy almost the same amount of space that the prior art circuit occupies.

While the invention has been particularly shown and described with reference to a preferred embodiment thereof, it will be understood to those skilled in the art that various changes in form and detail may be made therein without departing from the spirit and scope of the invention.

What is claimed is:

1. In a transistor switching circuit comprising a pass transistor, having source, gate, and drain, with its source connected to an input and its drain connected to an output; a fist turn-on transistor, having source, gate, and drain, with its drain connected to a clamping circuit and its source connected to a source of drive current; and a second turn-on transistor, having source, gate, and drain, with its source connected to the source of said pass transistor and its drain connected to the drain of said first turn on transistor; said pass and said first and second turn on transistors having a common gate connection; the improvement for obtaining a low idle power consumption comprising:

a bipolar transistor, having emitter, base, and collector, wherein said collector is connected to said common gate connection and said base is connected to the drain of said first turn on transistor such that said bipolar transistor turns on only during the transition from the open to closed condition of said first and second turn on transistors to thereby discharge the common gate capacitance of said transistors.

2. The combination according to claim 1 wherein a third transistor, having source, gate, and drain, is connected with its source and drain in series with said emitter of said bipolar transistor and said input, and with its gate connected to said common gate connection.

* * * * *